United States Patent
Herceg

(10) Patent No.: US 12,007,290 B2
(45) Date of Patent: Jun. 11, 2024

(54) METHOD AND APPARATUS FOR PROVIDING FOR A TIME DOMAIN BASED TEMPERATURE DETERMINATION

(71) Applicant: Nokia Technologies Oy, Espoo (FI)

(72) Inventor: Marijan Herceg, Osijek (HR)

(73) Assignee: Nokia Technologies Oy, Espoo (FI)

( * ) Notice: Subject to any disclaimer, the term of this patent is extended or adjusted under 35 U.S.C. 154(b) by 685 days.

(21) Appl. No.: 17/185,668

(22) Filed: Feb. 25, 2021

(65) Prior Publication Data
US 2021/0270681 A1    Sep. 2, 2021

(30) Foreign Application Priority Data

Feb. 27, 2020   (EP) .................................... 20159668

(51) Int. Cl.
*G01K 7/00*     (2006.01)
*G01K 7/16*     (2006.01)
(Continued)

(52) U.S. Cl.
CPC ............. *G01K 7/16* (2013.01); *G01K 15/005* (2013.01); *H03L 7/0816* (2013.01)

(58) Field of Classification Search
CPC .. G01K 7/16; G01K 15/0005; G01K 2219/00; G01K 7/00; G01K 7/346; H03L 7/08; G06F 13/12; G06F 15/78
See application file for complete search history.

(56) References Cited

U.S. PATENT DOCUMENTS 4,463,594 A * 8/1984 Raff .................... F02D 41/1481
73/23.31
5,216,301 A * 6/1993 Gleeson, III ........... H03K 5/135
327/119
(Continued)

FOREIGN PATENT DOCUMENTS

CN   106464606 A * 2/2017 ............ H04J 3/0635
CN   107505058 A   12/2017
(Continued)

OTHER PUBLICATIONS

17185668_2024-01-26_KR_102059429_B1_H.pdf, Dec. 27, 2019.*
(Continued)

*Primary Examiner* — Gail Kaplan Verbitsky
(74) *Attorney, Agent, or Firm* — Nokia Technologies Oy

(57) ABSTRACT

A method, apparatus and computer program product are provided to reliably determine a temperature, such as in the time domain. In this regard, an apparatus includes a delay line having a temperature dependent measurement invertor configured to stretch a clock pulse that was generated by an oscillating circuit during circulation of the clock pulse through the delay line. The amount by which the clock pulse is stretched during a cycle about the delay line is dependent upon temperature. The apparatus also includes detection circuitry configured to detect an instance in which clock pulse has been stretched so as to equal or exceed a period of the clock pulse. The apparatus further includes processing circuitry configured to determine the temperature based at least in part upon a number of cycles completed to stretch the clock pulse so as to equal or exceed the period of the clock pulse.

20 Claims, 10 Drawing Sheets

(51) Int. Cl.
*G01K 15/00* (2006.01)
*H03L 7/081* (2006.01)

(56) References Cited

U.S. PATENT DOCUMENTS

| | | | | |
|---|---|---|---|---|
| 5,412,697 | A * | 5/1995 | Van Brunt | G06F 13/423 327/98 |
| 6,922,111 | B2 * | 7/2005 | Kurd | H03L 7/091 331/65 |
| 9,322,717 | B1 * | 4/2016 | Dhaliwal | G01K 7/00 |
| 2003/0034848 | A1 * | 2/2003 | Norman | H03L 1/00 331/46 |
| 2008/0288196 | A1 | 11/2008 | Singh et al. | |
| 2009/0141770 | A1 | 6/2009 | Chen et al. | |
| 2012/0170616 | A1 | 7/2012 | Tsai et al. | |
| 2012/0189033 | A1 * | 7/2012 | Kim | G01K 7/346 374/163 |
| 2012/0307866 | A1 | 12/2012 | Chen | |
| 2016/0341604 | A1 * | 11/2016 | Kosonocky | G01K 13/00 |
| 2019/0064007 | A1 * | 2/2019 | Lesso | G01K 7/32 |

FOREIGN PATENT DOCUMENTS

| | | | | |
|---|---|---|---|---|
| EP | 1983650 | A1 * | 10/2008 | G04F 10/005 |
| EP | 3657650 | A1 | 5/2020 | |
| JP | H09159547 | A | 6/1997 | |
| KR | 100974217 | B1 * | 8/2010 | |
| KR | 20120045413 | A * | 5/2012 | |
| KR | 20120086036 | A * | 8/2012 | |
| KR | 20140121911 | A * | 10/2014 | |
| KR | 102059429 | B1 * | 12/2019 | |

OTHER PUBLICATIONS

17185668_2024-01-26_KR_20140121911_A_H.pdf,Oct. 17, 2014.*
17185668_2024-01-26_EP_1983650_A1_H.pdf,Oct. 22, 2008.*
17185668_2024-01-26_KR_100974217_B1_H.pdf,Aug. 6, 2010.*
17185668_2024-01-26_KR_20120086036_A_I.pdf,Aug. 2, 2012.*
17185668_2024-01-29_KR_20120045413_A_H.pdf,May 9, 2012.*
Chen et al., "A Time-to-Digital-Converter-Based CMOS Smart Temperature Sensor", IEEE Journal of Solid-State Circuits, vol. 40, No. 8, Aug. 2005, pp. 1642-1648.
Song et al., "An Ultralow Power Time-Domain Temperature Sensor With Time-Domain Delta-Sigma TDC", IEEE Transactions on Circuits and Systems II: Express Briefs, vol. 64, No. 10, Oct. 2017, pp. 1117-1121.
Anand et al., "A VCO Based Highly Digital Temperature Sensor With 0.034° C./mV Supply Sensitivity", IEEE Journal of Solid-State Circuits, vol. 51, No. 11, Nov. 2016, pp. 2651-2663.
Sarkar et al., "Linearization of NTC Thermistor Characteristic Using Op-Amp Based Inverting Amplifier", IEEE Sensors Journal, vol. 13, No. 12, Dec. 2013, pp. 4621-4626.
Rabaey et al., "Digital Integrated Circuits, a design perspective", 2nd Edition, Pearson Education, 2003, 514 pages.
"Digital Temperature Sensor", AMS, AS6221, v1-00, Nov. 16, 2020, pp. 1-38.
"2.4-V, 10-μA, SC-70 Temperature Sensor", Texas Instruments, LMT88, Jan. 2015, 23 pages.
"High-Accuracy PWM Output Temperature Sensors", Maxim Integrated, MAX6666/MAX6667, Apr. 2014, pp. 1-7.
"LMT01 0.5° C. Accurate 2-Pin Digital Output Temperature Sensor With Pulse Count Interface", Texas Instruments, LMT01, Jun. 2018, 35 pages.
Kim et al., "CMOS Integrated Time-mode Temperature Sensor for Self-refresh Control in Dram Memory Cell", IEEE Sensors Journal, vol. 16, No. 17, Sep. 1, 2016, pp. 6687-6693.
Chen et al., "All-digital Time-domain CMOS Smart Temperature Sensor with On-chip Linearity Enhancement", Sensors, vol. 16, No. 2, Feb. 2016, pp. 1-14.
Extended European Search Report received for corresponding European Patent Application No. 20159668.1, dated Aug. 31, 2020, 6 pages.

* cited by examiner

METHOD AND APPARATUS FOR PROVIDING FOR A TIME DOMAIN BASED TEMPERATURE DETERMINATION

TECHNOLOGICAL FIELD

An example embodiment relates generally to a method, apparatus and computer program product for determining temperature and, more particularly, to a method apparatus and computer program product for providing for a time domain based temperature determination.

BACKGROUND

The measurement of temperature is commonly performed in a wide variety of different applications. For example, the measurement of ambient or process temperature is a key parameter for many industrial applications. Additionally, the measurement of the temperature of the human body is also of import in relation to monitoring a person's health and/or properly diagnosing various illnesses. As another example of the various applications that benefit from temperature measurement, the thermal management of integrated circuits relies upon the repeated measurement of temperature of various components and/or locations within the integrated circuit. In this regard, the thermal management of integrated circuits has increased in importance as the circuit density and clock speed have increased, both of which can generate additional heat and potentially degrade performance unless the heat is properly monitored, such as by repeated temperature measurements, and dissipated.

One type of temperature sensor is a voltage domain temperature sensor. Voltage domain temperature sensors convert a measured temperature to a voltage. Another type of temperature sensor is a time domain temperature sensor which may sometimes be less complex than voltage domain temperature sensor and, as a result, advantageous relative to a voltage domain temperature sensor. In the time domain, a temperature sensor converts a measured temperature to a corresponding representation of time. This time representation is then subjected to a time-to-digital conversion to generate a corresponding output in the digital domain.

BRIEF SUMMARY

A method, apparatus and computer program product are provided in accordance with an example embodiment in order to reliably determine a temperature, such as in the time domain. By operating in the time domain, the method, apparatus and computer program product of an example embodiment may be less complex than at least some other temperature sensors, such as some voltage domain temperature sensors. Additionally, the method, apparatus and computer program product of an example embodiment may be less complex than other time domain temperature sensors since the ring oscillator is not directly utilized as to sense the temperature, thereby avoiding reliance upon frequency and/or period measurement circuits that may otherwise be utilized to measure the temperature dependent frequency and/or period of the ring oscillator. Additionally, the method, apparatus and computer program product of an example embodiment may be configured to internally generate a clock signal, thereby avoiding the need for additional clock generation circuitry, such as may otherwise be employed for temperature-to-digital conversion.

In an example embodiment, a method is provided that includes stretching, during circulation through a delay line, a clock pulse that was generated by an oscillating circuit. The amount by which the clock pulse is stretched during a cycle about the delay line is dependent upon temperature. The method also includes detecting an instance in which the clock pulse has been stretched so as to equal or exceed a period of the clock pulse. The method further includes determining the temperature based at least in part upon a number of cycles completed to stretch the clock pulse to equal or exceed the period of the clock pulse.

The method of an example embodiment also includes switchably connecting a temperature dependent measurement invertor to the osculating circuit to form the delay line in order to stretch the clock pulse by the amount that is dependent upon the temperature. In this example embodiment, the temperature dependent measurement invertor has a different response time to transition from a high output to a low output then to transition from the low output to the high output. As a result, the method of this example embodiment stretches the clock pulse by stretching the clock pulse during a respective cycle by an amount that is based upon a difference between the response time of the temperature dependent measurement invertor to transition from the high output to the low output and the response time of the temperature dependent measurement invertor to transition from the low output to the high output.

The method of an example embodiment stretches a clock pulse by repeatedly stretching the clock pulse during a plurality of cycles about the delay line. In an example embodiment, the method also includes maintaining a count of the number of cycles about the delay line since the temperature dependent measurement invertor was switchably connected to the oscillating circuit. The method of an example embodiment also includes switchably disconnecting the temperature dependent measurement invertor from the oscillating circuit in response to detecting the instance in which clock pulse has been stretched so as to equal or exceed the period of the clock pulse. In an example embodiment, the period of the clock pulse is defined by a time delay introduced by circulation of the clock pulse through the delay line.

In another example embodiment, an apparatus is provided that includes a delay line comprising a temperature dependent measurement invertor configured to stretch a clock pulse that was generated by an oscillating circuit during circulation of the clock pulse through the delay line. The amount by which the clock pulse is stretched during a cycle about the delay line is dependent upon temperature. The apparatus also includes detection circuitry configured to detect an instance in which clock pulse has been stretched so as to equal or exceed a period of the clock pulse. The apparatus further includes processing circuitry configured to determine the temperature based at least in part upon a number of cycles completed to stretch the clock pulse so as to equal or exceed the period of the clock pulse.

The temperature dependent measurement invertor of an example embodiment is configured to have a different response time to transition from a high output to a low output than to transition from a low output to the high output. In this example embodiment, the temperature dependent measurement invertor may include a temperature dependent resistor having a resistance value is that dependent upon temperature. Alternatively, the temperature dependent measurement invertor may include voltage to current conversion circuitry configured to receive and be responsive to an input signal having a temperature dependent voltage. In an example embodiment, the temperature dependent measurement invertor is configured to stretch the clock pulse during a respective cycle by an amount that is based upon a difference between the response time of the temperature dependent measurement invertor to transition from the high output to the low output and the response time of the temperature dependent measurement invertor to transition from the low output to the high output.

The delay line of an example embodiment is further configured to repeatedly stretch the clock pulse during a plurality of cycles thereabout. The apparatus of an example embodiment also includes a switch configured to switchably connect the temperature dependent measurement invertor to the oscillating circuit to form the delay line. The apparatus of this example embodiment also includes counter circuitry configured to maintain a count of the number of cycles about the delay line since the temperature dependent measurement invertor has been switchably connected to the oscillating circuit. The switch of this example embodiment is also configured to switchably disconnect the temperature dependent measurement invertor from the oscillating circuit in response to detection by the detection circuitry that the clock pulse has been stretched so as to equal or exceed the period of the clock pulse.

In a further example embodiment, a computer program product is provided that includes a non-transitory computer readable medium comprising computer instructions stored thereon and configured, upon execution, to receive an indication representative of a count of a number of cycles about a delay line that were completed to stretch a clock pulse that was generated by an oscillating circuit so as to equal or exceed a period of the clock pulse. The amount by which the clock pulse is stretched during a cycle about the delay lines is dependent upon temperature. The computer instructions are also configured, upon execution, to determine the temperature based at least in part upon the number of cycles completed to stretch the clock pulse so as to equal or exceed the period of the clock pulse.

The computer instructions configured in accordance with an example embodiment to determine the temperature include computer instructions configured to determine the temperature in a manner that has an indirect relationship to the number of cycles completed to stretch the clock pulse so as to equal or exceed the period of the clock pulse. In an example embodiment, the computer instructions configured to determine a temperature include computer instructions configured to determine the temperature based at least in part upon a difference between a time delay created by the delay line and a width in time of the clock pulse initially generated by the oscillating circuit. In an alternative embodiment, the computer instructions configured to determine the temperature include computer instructions configured to determine the temperature based a predefined relationship between the number of cycles and the temperature.

In an example embodiment, a computer program is provided that includes instructions for receiving an indication representative of a count of a number of cycles about a delay line that were completed to stretch a clock pulse that was generated by an oscillating circuit so as to equal or exceed a period of the clock pulse. The amount by which the clock pulse is stretched during a cycle about the delay lines is dependent upon temperature. The instructions are also for determining the temperature based at least in part upon the number of cycles completed to stretch the clock pulse so as to equal or exceed the period of the clock pulse.

In yet another example embodiment, an apparatus is provided that includes means for stretching a clock pulse that was generated by an oscillating circuit during circulation of the clock pulse through a delay line. The amount by which the clock pulse is stretched during a cycle about the delay line is dependent upon temperature. The apparatus also includes means for detecting an instance in which the clock pulse has been stretched so as to equal or exceed a period of the clock pulse. The apparatus further includes means for determining the temperature based at least in part upon a number of cycles completed to stretch the clock pulse so as to equal or exceed the period of the clock pulse.

The means for stretching the clock pulse in accordance with an example embodiment, includes a temperature dependent measurement invertor that is configured to have a different response time to transition from a high output to a low output than to transition from the low output to the high output. The temperature dependent measurement invertor may include a temperature dependent resistor having a resistance value that is dependent upon temperature. Alternatively, the temperature dependent measurement invertor may include voltage to current conversion circuitry configured to receive and be responsive to an input signal having a temperature dependent voltage. The temperature dependent measurement invertor may be configured to stretch the clock pulse during a respective cycle by an amount based upon a difference between the response time of the temperature dependent measurement invertor to transition from the high output to the low output and the response time of the temperature dependent measurement invertor to transition from the low output to the high output.

The apparatus of an example embodiment also includes means for switchably connecting the temperature dependent measurement invertor to the oscillating circuit to form the delay line. The apparatus of this embodiment also includes means for maintaining a count of the number of cycles about the delay line since the temperature dependent measurement invertor has been switchably connected to the oscillating circuit. The apparatus of this example embodiment further includes means for switchably disconnecting the temperature dependent measurement invertor from the oscillating circuit in response to detecting that the clock pulse has been stretched so as to equal or exceed a period of the clock pulse.

BRIEF DESCRIPTION OF THE DRAWINGS

Figure 1:
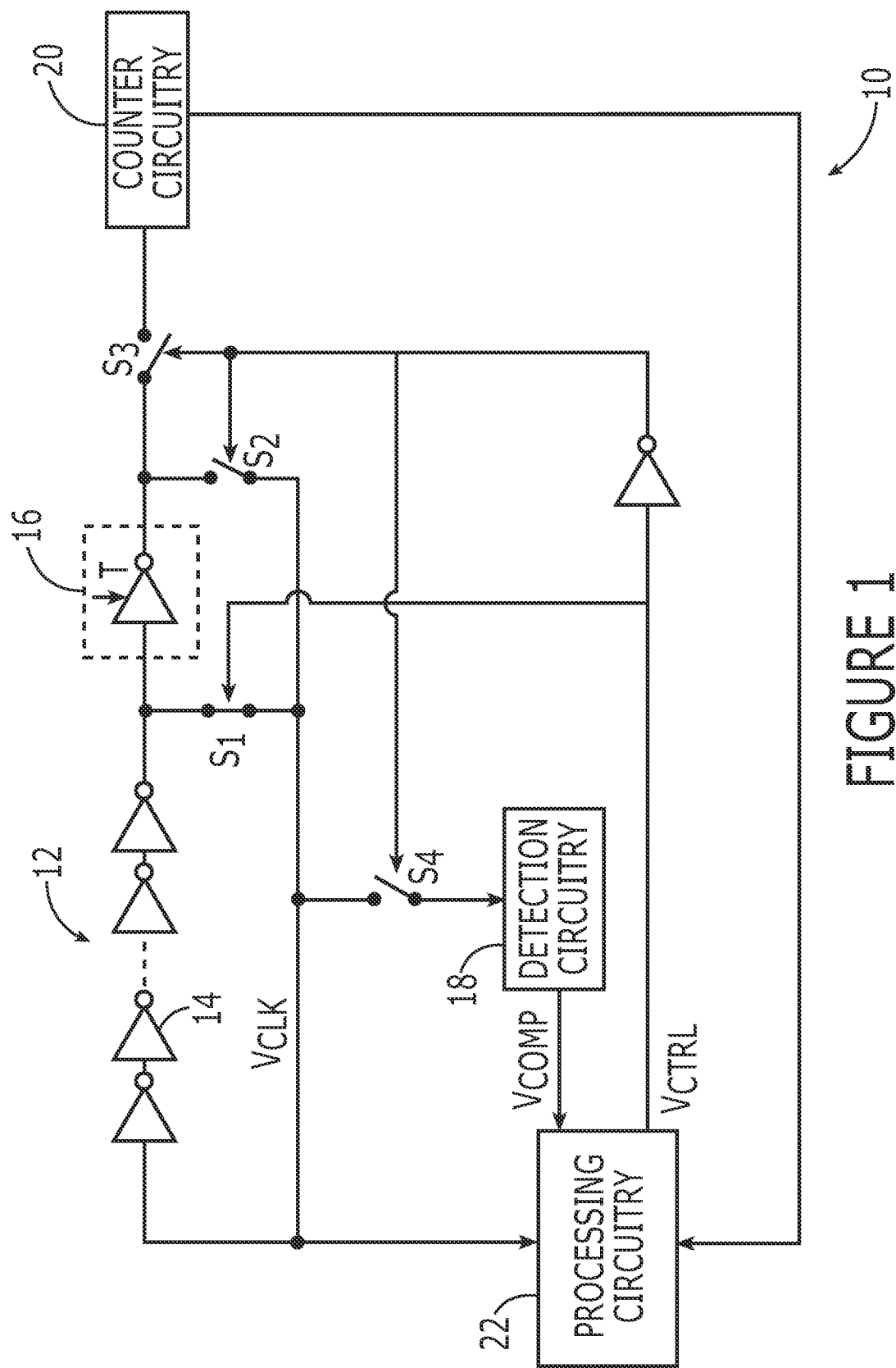
Figure 2A:
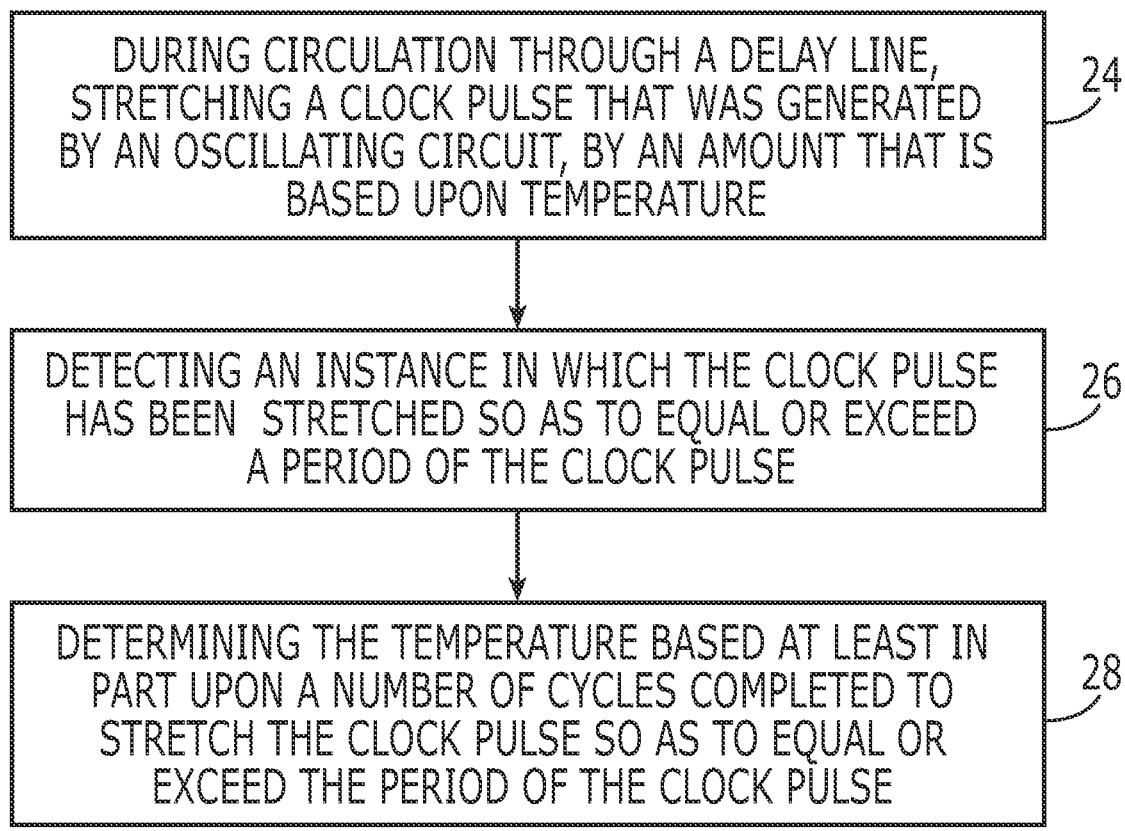
Figure 2B:
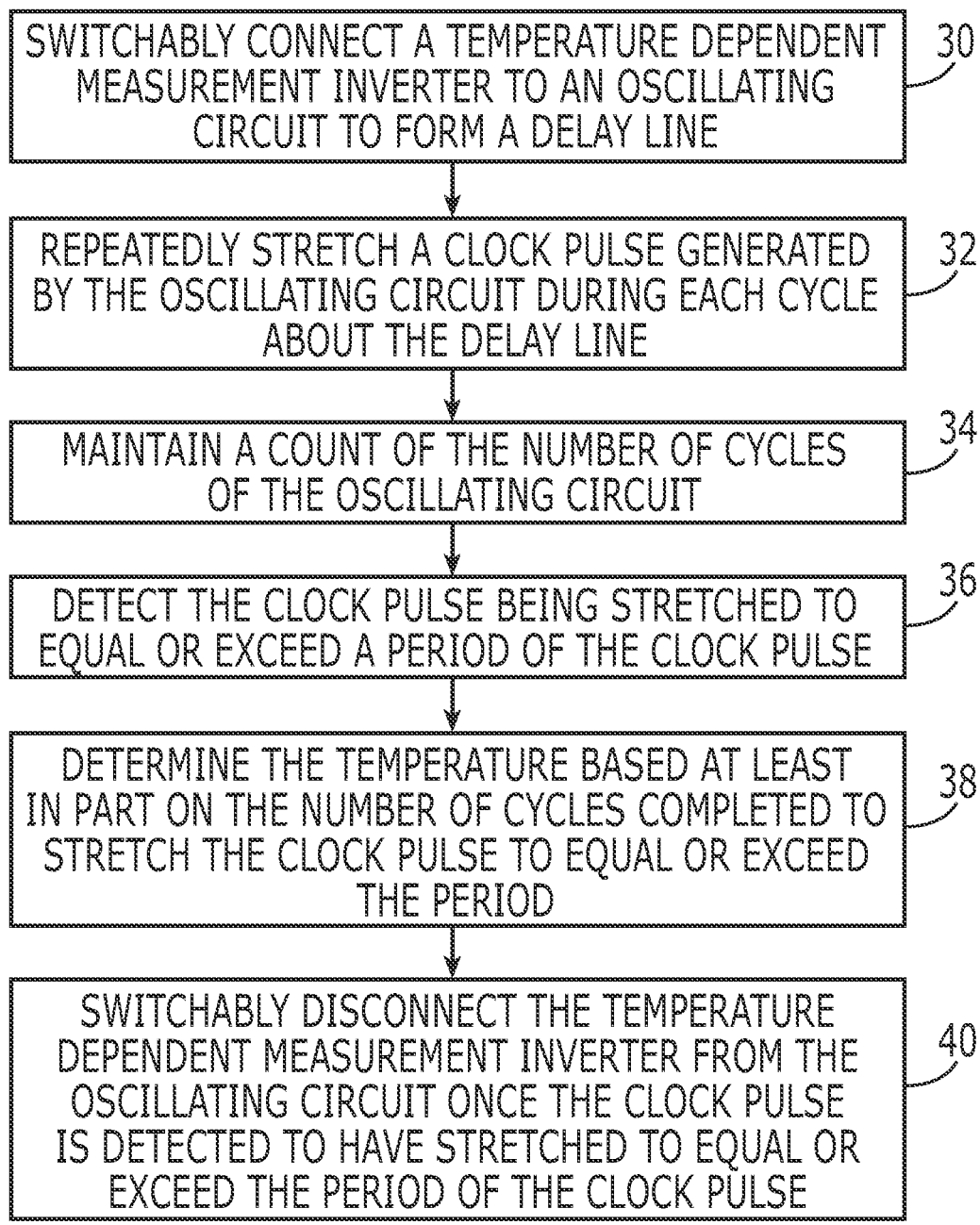
Figure 3:
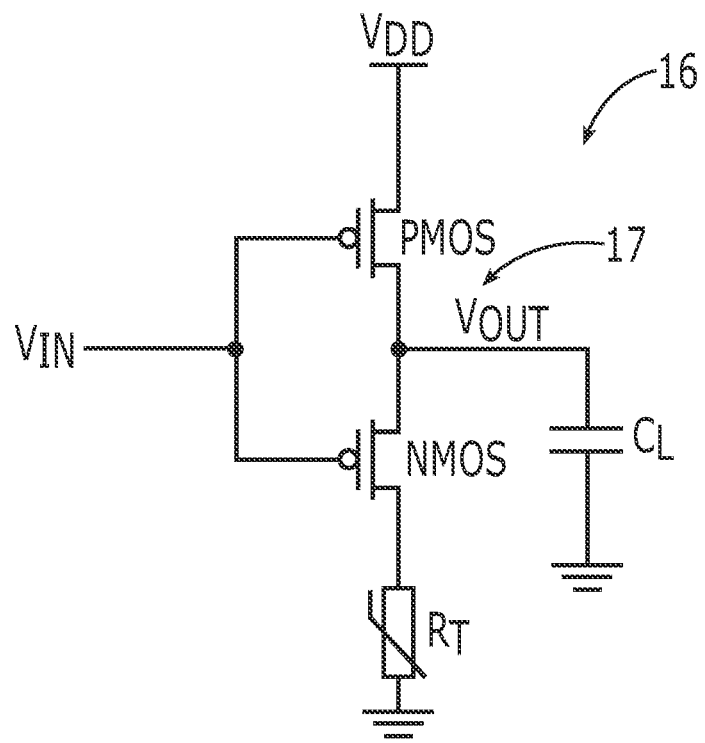
Figure 4:
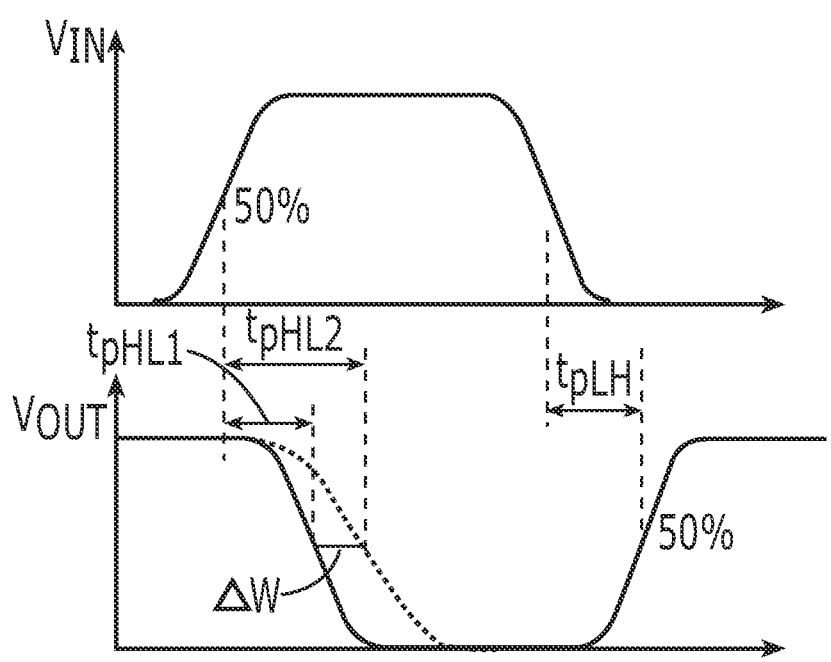
Figure 5:
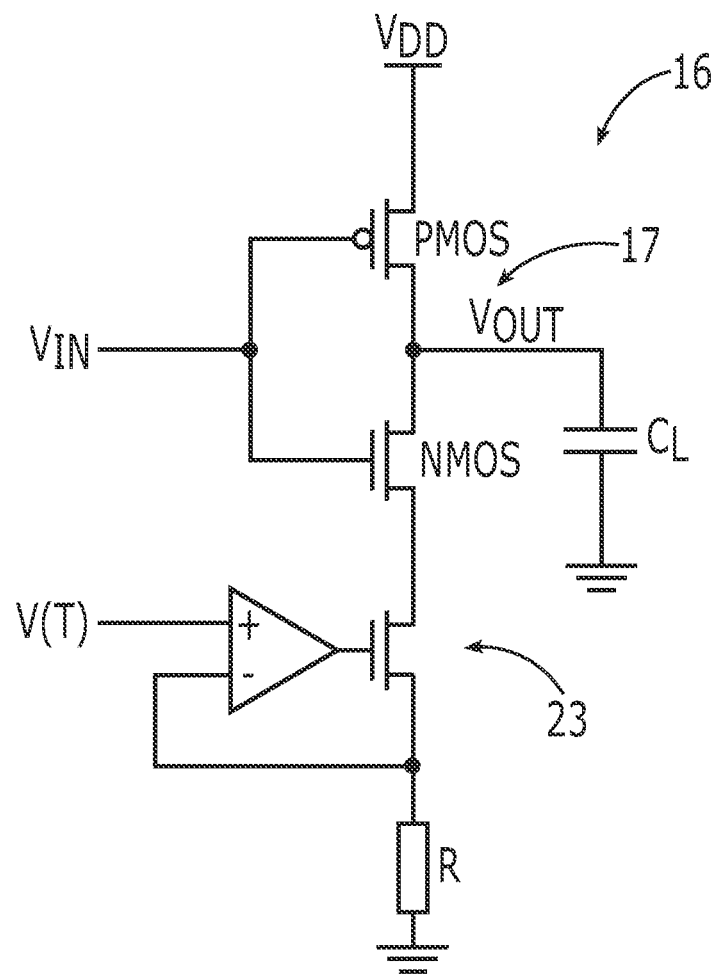
Figure 6:
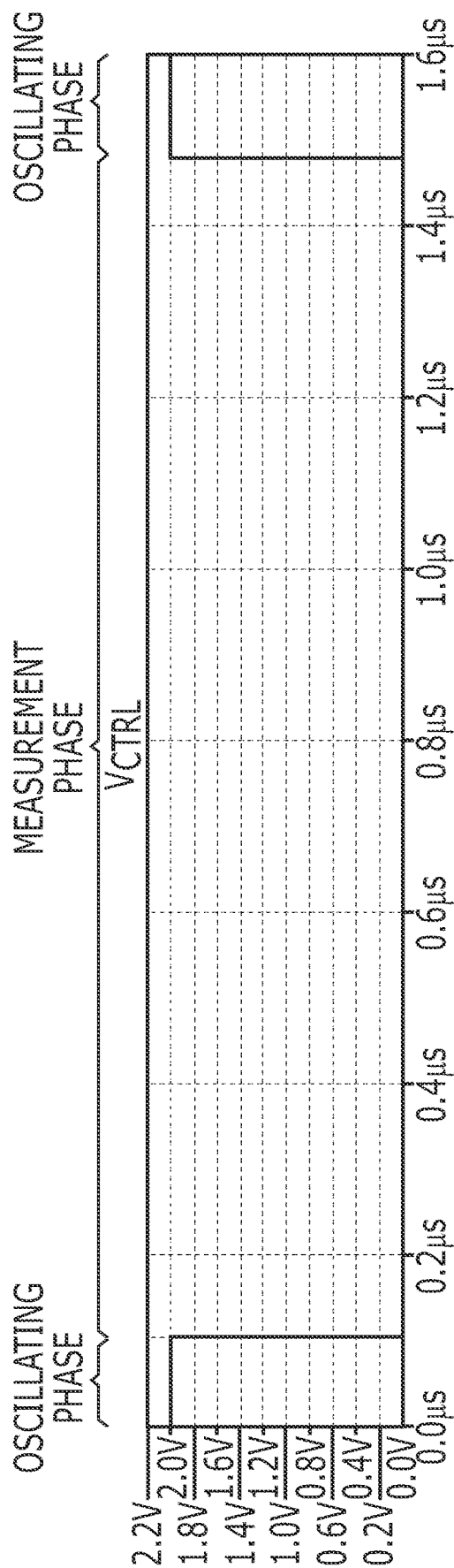
Figure 7:
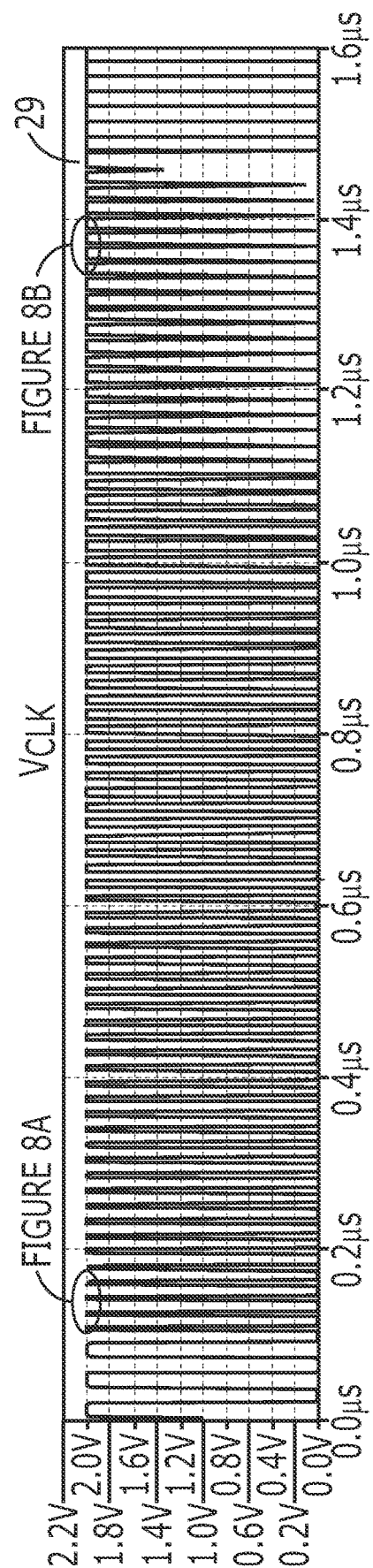
Figure 8A:
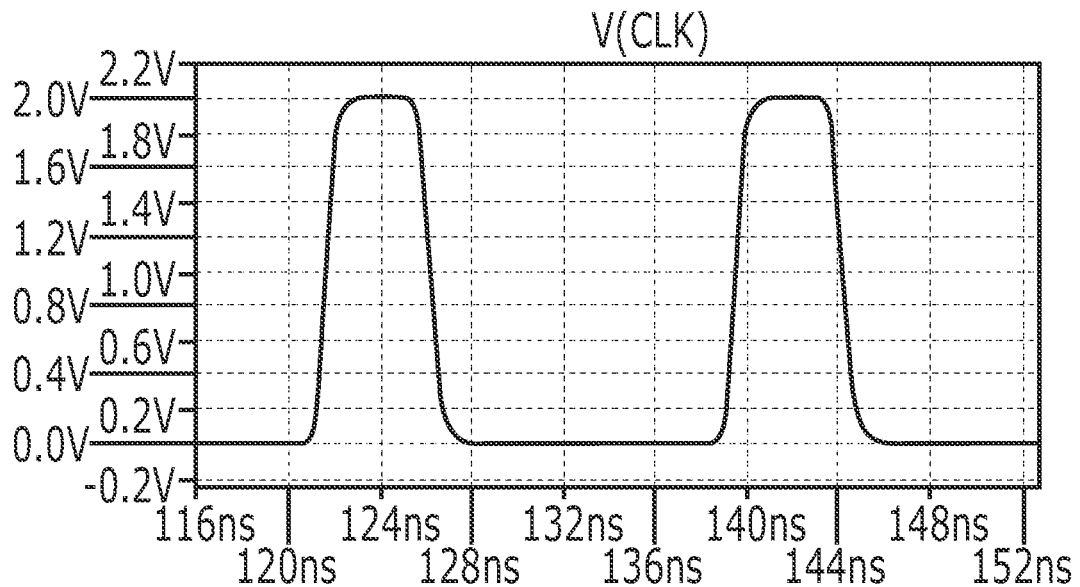
Figure 8B:
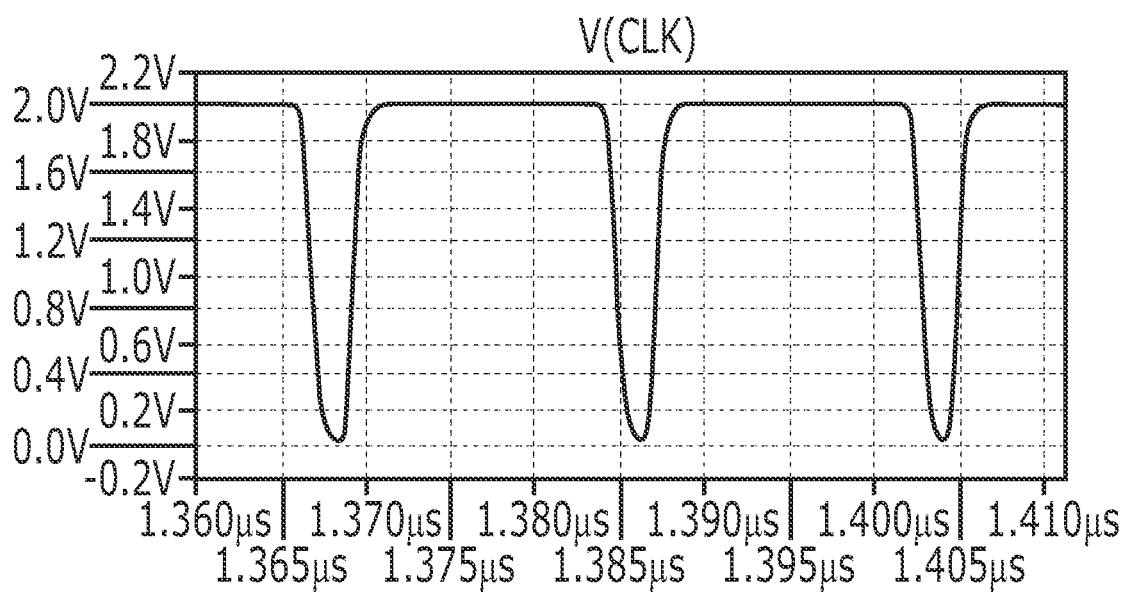
Figure 9:
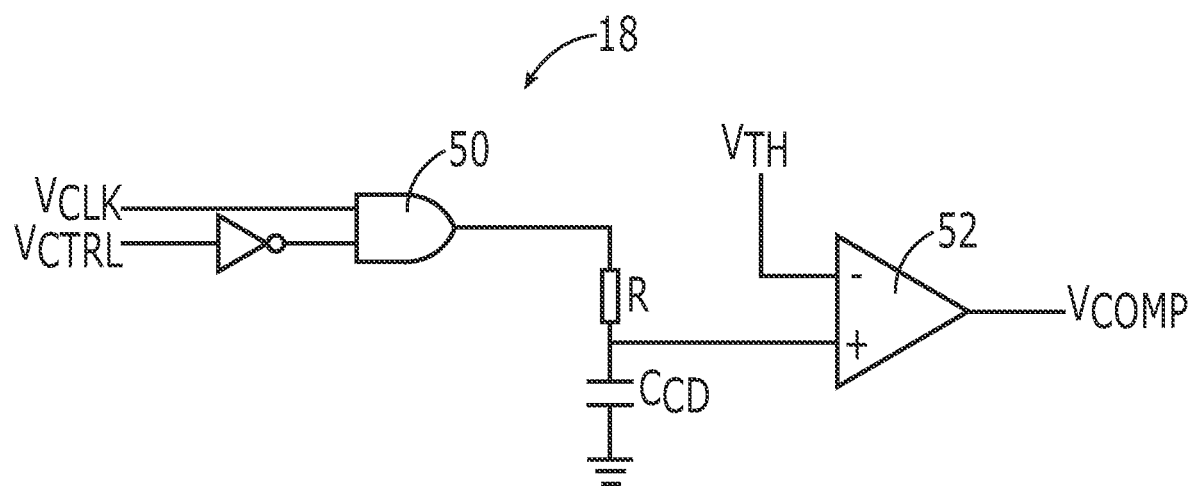
Figure 10:
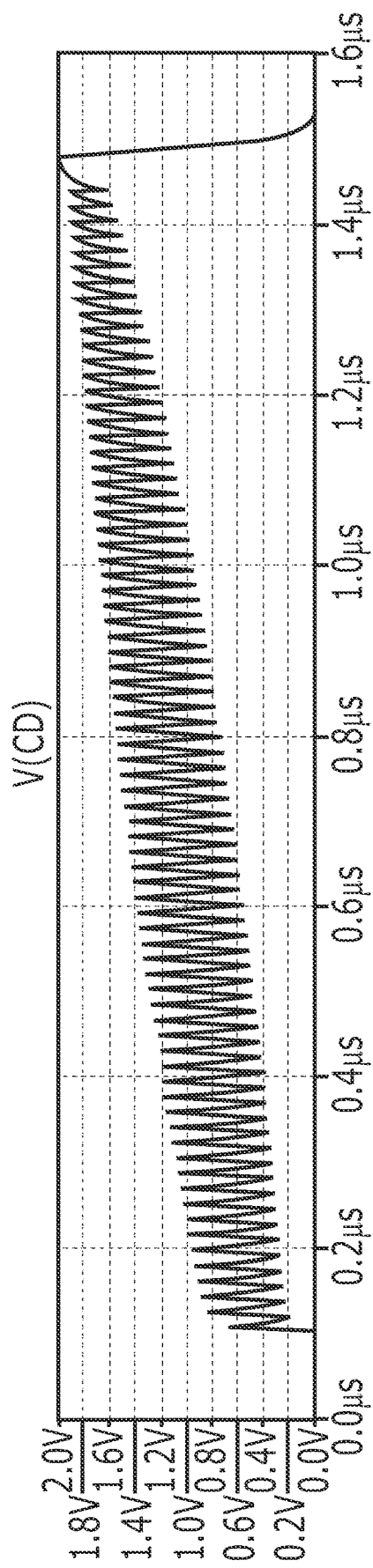
Figure 11:
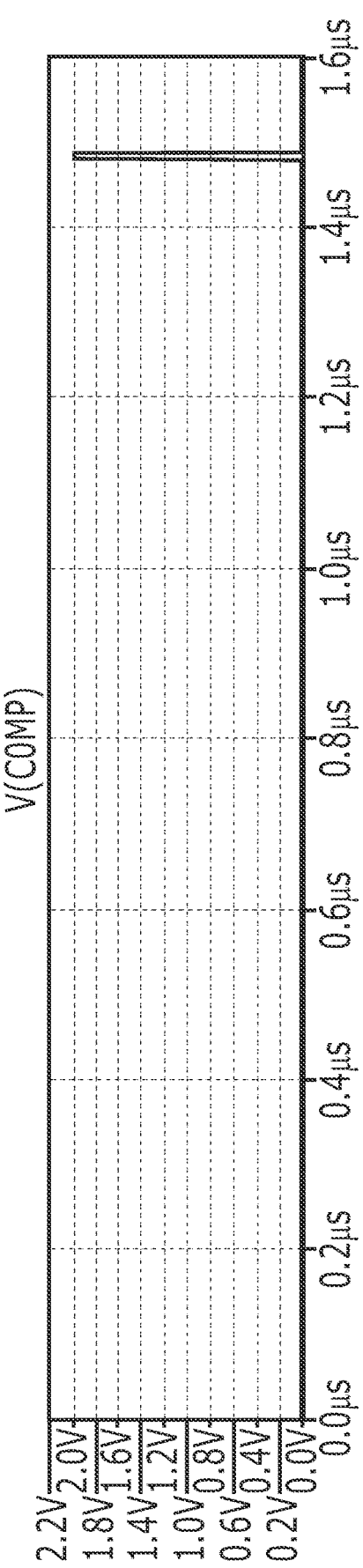
Figure 12:
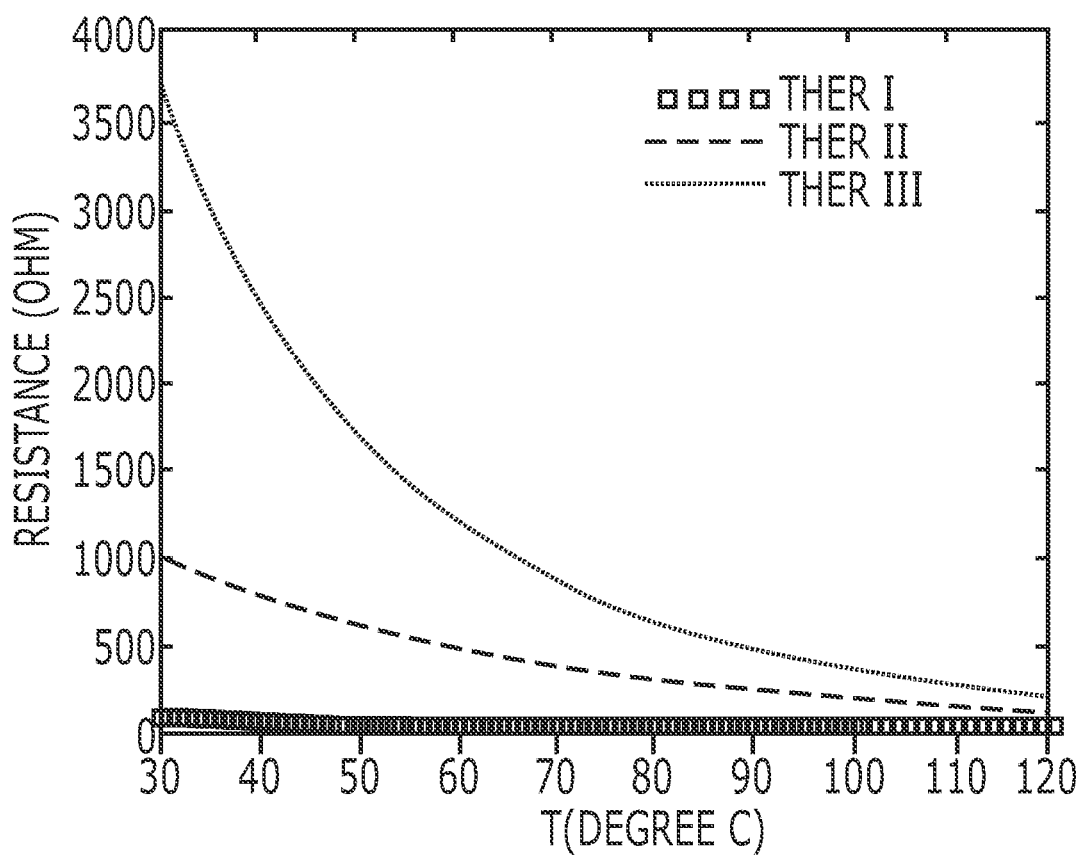
Figure 13:
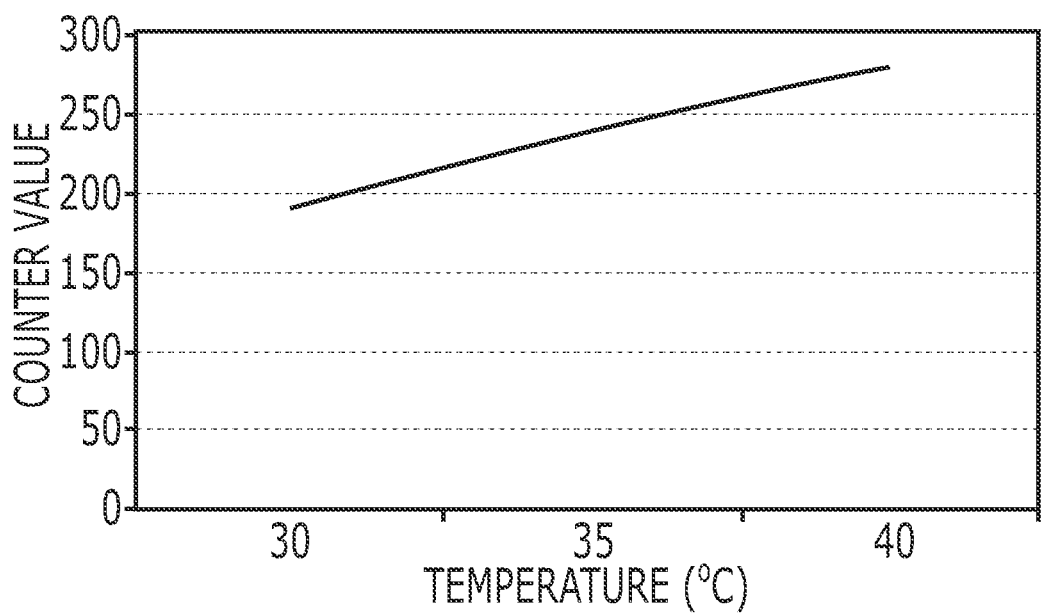

Having thus described certain embodiments of the invention in general terms, reference will now be made to the accompanying drawings, which are not necessarily drawn to scale, and wherein:

FIG. 1 is a circuit diagram of an apparatus in accordance an example embodiment of the present disclosure;

FIG. 2A is a flow chart illustrating operations performed, such as by the apparatus of FIG. 1, in accordance with an example embodiment of the present disclosure;

FIG. 2B is a flow chart illustrating operations performed, such as by the apparatus of FIG. 1, in accordance with a more detailed example embodiment of the present disclosure;

FIG. 3 is a circuit diagram of a temperature dependent measurement invertor in accordance with an example embodiment of the present disclosure;

FIG. 4 is a graphical representation of the stretching of a clock pulse by a temperature dependent measurement invertor in accordance with an example embodiment of the present disclosure;

FIG. 5 is a circuit diagram of a temperature dependent measurement invertor in accordance with an alternative embodiment of the present disclosure;

FIG. 6 is a graphical representation of a control signal $V_{CTRL}$ that defines the operational phase of the apparatus, such as an oscillating phase or a measurement phase, in accordance with an example embodiment of the present disclosure;

FIG. 7 is a graphical representation of the clock pulse generated by an oscillating circuit and then stretched during one or more cycles about a delay line in accordance with an example embodiment of the present disclosure;

FIG. 8A is an enlarged graphical representation of a portion of FIG. 7 illustrating the clock pulse initially generated by the oscillating circuit at the time by which a temperature dependent measurement invertor is switchably connected to the oscillating circuit to form the delay line in accordance with an example embodiment of the present disclosure;

FIG. 8B is a graphical representation of a portion of FIG. 7 depicting the clock pulse after having been stretched during a plurality of cycles about the delay line and shortly before the clock pulse is stretched to such an extent as to equal or exceed the period of the clock pulse in accordance with an example embodiment of the present disclosure;

FIG. 9 is a circuit diagram of detection circuitry in accordance with an example embodiment of the present disclosure;

FIG. 10 is a graphical representation of the voltage $V_{CD}$ across a capacitor $C_{CD}$ of the detection circuitry of FIG. 9 in accordance with an example embodiment of the present disclosure;

FIG. 11 is a graphical representation of a signal $V_{COMP}$ provided by the detection circuitry that indicates an instance in which the clock pulse has been stretched so as to equal or exceed the period of the clock pulse in accordance with an example embodiment of the present disclosure;

FIG. 12 is a graphical representation of the resistance of three different temperature dependent resistors at various temperatures; and FIG. 13 is a graphical representation of a relationship between the number of cycles completed to stretch the clock pulse so as to equal or exceed the period of the clock pulse and the temperature in accordance with an example embodiment of the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that rely upon software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device (such as a core network apparatus), field programmable gate array, and/or other computing device.

As defined herein, a "computer-readable storage medium," which refers to a physical and non-transitory storage medium (e.g., volatile or non-volatile memory device), may be differentiated from a "computer-readable transmission medium," which refers to an electromagnetic signal.

A method, apparatus and computer program product are provided in accordance with an example embodiment in order to determine a temperature. The temperature may be determined in the time domain and, as a result, the method, apparatus and computer program product of an example embodiment may be less complex than at least some other temperature sensors. The method, apparatus and computer program product of an example embodiment may be utilized in any of a variety of different applications including, for example, various industrial applications in order to measure the ambient or process temperature. As another example, the method, apparatus and computer program product of some embodiments may be utilized in order to determine the temperature of a person or an animal, such as for diagnostic or other health monitoring purposes. As yet another example, the method, apparatus and computer program product of one embodiment may be configured to determine the temperature of various components of a circuit, such as an integrated circuit, in order to provide for effective thermal management of the circuit.

Regardless of the application, the apparatus 10 of one example embodiment is depicted in FIG. 1. As described below, the apparatus of this example embodiment is configured to have two operational phases, namely, an oscillating phase and a measurement phase. As configured in FIG. 1, the apparatus is in the oscillating phase as a first switch $S_1$ has been closed and the other switches $S_2$, $S_3$ and $S_4$ are open.

The apparatus 10 includes an oscillating circuit 12 configured to generate a clock pulse. In the illustrated embodiment, the oscillating circuit includes a ring oscillator that, in turn, includes a plurality of invertors 14 and, more particularly, an odd number of invertors connected in series. In the oscillating phase as shown in FIG. 1 in which the first switch $S_1$ is closed, the output of the last of the serially connected invertors is connected to the input of the first of the serially connected invertors such that the ring oscillator oscillates and generates a clock pulse.

To obtain a temperature measurement of an object or a location, the apparatus 10 includes a temperature dependent measurement invertor 16 that is positioned (or at least that portion of the measurement invertor that is temperature dependent is positioned) relative to the object or location such that the measurement invertor experiences and responds to its temperature. In order to switch to the measurement phase in order to sense the temperature of the object or location, the first switch $S_1$ is opened and the other switches $S_2$, $S_3$ and $S_4$ are closed in order to switchably connect the temperature dependent measurement invertor to the oscillating circuit 12, such as by being placed in series with the plurality of invertors 14 of the ring oscillator. Since the ring oscillator includes an odd number of invertors, the serial connection of the temperature dependent measurement invertor to the invertors of the ring oscillator results in an even number of invertors that are serially connected. Although the output of the temperature dependent measurement invertor is connected, as a result of the closure of this second switch $S_2$, to the input of the first of the serially connected invertors of the ring oscillator, the clock pulse that was generated by the oscillating circuit no longer oscillates and, instead, the clock pulse is stretched as a result of the temperature dependence of the measurement invertor and as described below. In particular, the switchable connection of the temperature dependent measurement invertor to the plurality of invertors of the ring oscillator forms a delay line about which the clock pulse circulates with the clock pulse being stretched during each cycle about the delay line as a result of the temperature dependence of the measurement invertor.

The apparatus 10 of this example embodiment also includes detection circuitry 18 configured to detect an instance in which the clock pulse has been stretched so as to equal or exceed the period of the clock pulse. By equaling or exceeding the period of the clock pulse, the clock pulse effectively disappears such that there is no longer a pulse that circulates about the delay line, but, instead, the delay line is simply maintained at a constant voltage, e.g., at the high level for a clock pulse that previously alternated between predefined low and high levels. As also shown in FIG. 1, the apparatus of this embodiment further includes counter circuitry 20 configured to maintain a count of the number of cycles about the delay line since the temperature dependent measurement invertor 16 was switchably connected to the oscillating circuit 12. The apparatus of this example embodiment further includes processing circuitry 22 configured to determine the temperature based at least in part upon the number of cycles, such as determined by the counter circuitry, that were needed to be completed to stretch the clock pulse so as to equal or exceed the period of the clock pulse.

Additionally, the processing circuitry 22 of this example embodiment is configured to issue a control signal $V_{CTRL}$ configured control the operational phase of the apparatus 10, such as by controllably positioning the switches. For example, the processing circuitry is configured to cause the transition from the oscillating phase to the measurement phase as described above by issuing a control signal $V_{CTRL}$ that causes the first switch $S_1$ to be opened and the other switches $S_2$, $S_3$ and $S_4$ to be closed in order to connect the temperature dependent measurement invertor 16 to the oscillating circuit 12 and to connect the detection circuitry 18 and the counter circuitry 20 to the resulting delay line, thereby providing for the measurement of the temperature. Similarly, the processing circuitry is configured to cause a transition from the measurement phase to the oscillating phase in an instance in which the clock pulse has been stretched so as to equal or exceed the period of the clock pulse by issuing the control signal $V_{CTRL}$ that causes the first switch $S_1$ to again be closed and the other switches $S_2$, $S_3$ and $S_4$ to again be opened in order to disconnect the temperature dependent measurement invertor from the oscillating circuit and to also disconnect the detection circuitry and the counter circuitry. The apparatus 10 may then again operate in accordance with the oscillating phase until another temperature measurement is to be acquired, at which time the processing circuitry is configured, such as in response to user input, to issue the control signal $V_{CTRL}$ that reconfigures the switches so as to commence the measurement phase.

With reference now to FIGS. 2A and 2B, the operations performed, such as by the apparatus 10 of FIG. 1, in accordance with certain example embodiments are depicted. As shown in block 24 of FIG. 2A, the apparatus of an example embodiment includes means, such as such as the delay line and, more particularly, the temperature dependent measurement invertor 16, for stretching a clock pulse that was generated by the oscillating circuit 12 during circulation of the clock pulse through the delay line. The amount by which the clock pulse is stretched during each cycle through the delay line is dependent upon temperature.

In relation to a more detailed embodiment and as shown in block 30 of FIG. 2B, the apparatus 10 of an example embodiment includes means, such as the processing circuitry 22 and one or more switches, e.g., the second switch $S_2$, for switchably connecting the temperature dependent measurement invertor 16 to the oscillating circuit 12. In this example embodiment, the apparatus may be operating in accordance with the oscillating phase and an input may be provided, such as by a user, a control system, a controller operating in accordance with a predefined schedule or the like, that indicates that there should be a transition to the measurement phase in order to sense the temperature of an object or a location, such as by the temperature dependent measurement invertor. In order to sense the temperature of the object or the location, the temperature dependent measurement invertor (or at least that portion of the measurement invertor that is temperature dependent) may be positioned relative to the object or location such that the measurement invertor experiences and responds to its temperature, such as by being proximate to or otherwise in thermal communication with the object or the location.

In response to the input or other indication that the temperature of an object or a location should be sensed, the processing circuitry 22 of an example embodiment is configured to issue a control signal $V_{CTRL}$ that causes the first switch $S_1$ that serves to at least partially define the oscillating circuit 12, such as the ring oscillator, to open and that causes a second switch $S_2$ to be closed in order to switchably connect the temperature dependent measurement invertor 16 to the ring oscillator in order to form a delay line, thereby using the ring oscillator both as the oscillating circuit during the oscillating phase and as a part of the delay line during the measurement phase. Although the control signal may be defined in different manners, the processing circuitry of the illustrated example provides a control signal $V_{CTRL}$ that is logical 1 and logical 0 during the oscillating and measurement phases, respectively. In an example embodiment, the processing circuitry is configured to transition from the oscillating phase to the measurement phase, while the output of the ring oscillator (in other words, the input to the temperature dependent measurement invertor) is a logical 0 such that an initial pulse is provided to the resulting delay line without the need for an additional reference pulse generator or a separate delay line. The control signal $V_{CTRL}$ that causes the first switch $S_1$ to be opened and the second switch $S_2$ to be closed may also be configured to cause one or more other switches, such as a third switch $S_3$ and fourth switch $S_4$ to be closed concurrent with the second switch $S_2$ during the measurement phase in order to connect the counter circuitry 20 and the detection circuitry 18, respectively, to the delay line.

As shown in block 32 of FIG. 2B and as described above in relation to block 24 of FIG. 2A, the apparatus 10 of this example embodiment also includes means, such as the delay line and, more particularly, the temperature dependent measurement invertor 16, for repeatedly stretching a clock pulse initially generated by the oscillating circuit 12 during each cycle about the delay line. In this regard, the temperature dependent measurement invertor may be configured to stretch the clock pulse by a predefined amount during each cycle about the delay line. With respect to a clock pulse that alternately transitions between a high level representative of a logical 1 and a low level representative of a logical 0, the temperature dependent measurement resistor of an example embodiment may be configured to stretch the clock pulse such that the length of time at which the clock pulse remains at the high level is increased by a predefined amount during each cycle about the delay line, while the length of time that the clock pulse remains at the low level correspondently decreases by the same amount during each cycle about the delay line. As a result, the period of the clock pulse remains unchanged, but the duty cycle of the clock pulse is increased by the temperature dependent measurement invertor during each cycle about the delay line.

The temperature dependent measurement invertor 16 may be embodied in various manners. One example embodiment of a temperature dependent measurement invertor is depicted in FIG. 3. The temperature dependent measurement invertor of this example embodiment receives the clock pulse at its input $V_{IN}$ from the last of the plurality of serially connected invertors of the ring oscillator and generates an output voltage $V_{OUT}$ that is provided to the first of the plurality of serially connected invertors of the ring oscillator. The temperature dependent measurement invertor of this example embodiment includes an invertor circuit 17 formed of a pair of transistors, e.g., a p-type metal oxide semiconductor (PMOS) field effect transistor and an n-type MOS (NMOS) field effect transistor, and a temperature dependent resistor $R_T$, such as a thermistor, connected to the invertor circuit, such as by being connected to the (NMOS) transistor of the invertor circuit in the illustrated embodiment. The temperature dependent resistor is exposed to the temperature to be measured such that the resistance of the temperature dependent resistor changes accordingly. The temperature dependent measurement invertor of this example embodiment also includes a load capacitance $C_L$ connected to the output $V_{OUT}$ of the invertor circuit.

The manner in which the temperature dependent measurement invertor 16 of this example embodiment is configured to stretch the clock pulse during a cycle about the delay line is depicted in FIG. 4. In this regard, the graphical waveform of the input voltage $V_{IN}$ is shown as well as the corresponding output voltage $V_{OUT}$ following its inversion. As illustrated, the temperature dependent measurement invertor has a different response time $t_{pHL}$ to transition from a high output to a low output than the response time $t_{pLH}$ to transition from the low output to the high output. This difference in the response time to transition from the high output to the low output relative to the transition from the low output to the high output provides for the stretching of the clock pulse. In this regard, the temperature dependent measurement invertor of the example embodiment of FIG. 3 is configured to stretch the clock pulse during a respective cycle about the delay line by an amount that is based upon and, in one embodiment, by an amount equal to the difference between the response time $t_{pHL}$ for the temperature dependent measurement invertor to transition from the high output to the low output and the response time $t_{pLH}$ of the temperature dependent measurement invertor to transition from the low output to the high output.

As shown in FIG. 4, the response times are defined as the difference in time between the time at which the input and output voltages $V_{IN}$ and $V_{OUT}$ are halfway, that is, 50% between the low and high states of a corresponding transition. Thus, with respect to the response time $t_{pHL}$ to transition from the high output to the low output, the response time is defined as the time period between the time at which the input voltage $V_{IN}$ is halfway between the low output and the high output during an upward transition and the time at which the output voltage $V_{OUT}$ is halfway between the high output and the low output during a downward transition. Similarly, with respect to the response time $t_{pLH}$ to transition from the low output to the high output, the response time is defined as the time period between the time at which the input voltage $V_{IN}$ is halfway between the high output and the low output during a downward transition and the time at which the output voltage V OUT is halfway between the low output and the high output during an upward transition. In this embodiment, the response time $t_{pHL}$ to transition from the high output to the low output may also be defined as:

$$t_{pHL} = \ln(2)(R_{mos} + R_T)C_L$$

and response time $t_{pLH}$ to transition from the low output to the high output may also be defined as:

$$t_{pLH} = \ln(2)R_{mos}C_L$$

wherein $R_{mos}$ is the output resistance of the invertor circuit 17. As a result of the differences in the transition times, the amount ΔW by which the clock pulse is stretched during each cycle about the delay line in this example embodiment may also be defined as:

$$\Delta W = t_{pHL} - t_{pLH} = \ln(2)R_T C_L$$

As an example of the temperate dependence of the measurement invertor 16, FIG. 4 depicts two different response times $t_{pHL}$ for the transition from the high output to the low output with the two different transition times being reflective of the exposure of the temperature dependent measurement invertor to two different temperatures. In this regard, the temperature that generates the larger response time, that is, $t_{pHL2}$ it may be greater than the temperature that generates the smaller response time $t_{pHL1}$.

As noted above, the temperature dependent measurement invertor 16 may be differently embodied. For example, FIG. 5 depicts an alternative embodiment of the temperature dependent measurement invertor. In this example embodiment, the temperature dependent measurement invertor includes voltage to current conversion circuitry 23 that is configured to receive and be responsive to an input signal V(T) having a temperature dependent voltage. Thus, the input signal V(T) having the temperature dependent voltage varies depending upon the temperature to be measured. As a result of the variations in the temperature dependent voltage of the input signal, the resistance of the voltage to current conversion circuitry correspondingly varies such that different amounts of current I are drawn. Consequently, the voltage to current conversion circuitry of this example embodiment also causes a clock pulse presented at the input $V_{IN}$ of the temperature dependent measurement invertor to be stretched prior to being output $V_{OUT}$, such as in a comparable manner as described above in conjunction with FIG. 4. Regardless of the manner in which the temperature dependent measurement invertor is embodied, it is noted that the temperature dependent measurement invertor serves to measure the temperature and the ring oscillator is not directly used as a temperature sensor such that the frequency or period measurement circuits that may be utilized in other types of temperature sensors in which a ring oscillator does provide the temperature measurement are not necessary to measure the temperature dependent frequency or period of the ring oscillator.

By way of further illustration of the manner in which a clock pulse is stretched, reference is now made to FIGS. 6, 7, 8A and 8B. FIG. 6 depicts the control signal $V_{CTRL}$ generated by the processing circuitry 22. As described above, the control signal $V_{CTRL}$ of the example embodiment is a logical 1 during the oscillating phase and a logical 0 during the measurement phase. As shown in FIG. 7 and in more detail in FIG. 8A which enlarges a portion of the clock pulse, designated $V_{CLK}$ in FIG. 1, at or shortly after the transition from the oscillating phase to the measurement phase, the clock pulse has a relatively small duty cycle, such as less than 50%. Thereafter, the clock pulse is stretched during each cycle about the delay line with the duty cycle of the clock pulse gradually increasing throughout the measurement phase as shown in FIG. 7. By way of example, FIG. 8B provides an enlarged representation of a portion of the clock pulse after the clock pulse has been repeatedly stretched by the temperature dependent measurement invertor 16, which illustrates that the clock pulse now has a relatively large duty cycle, such as substantially greater than 50% and, more particularly, approaching 100%. The temperature dependent measurement invertor continues to stretch the clock pulse during each cycle through the delay line such that the clock pulse eventually disappears as indicated at 29 in FIG. 7 as a result of the clock pulse having been stretched such that one state of the clock pulse, e.g., the high state, equals or exceeds the period of the clock pulse.

In an example embodiment, the apparatus 10 also includes means, such as counter circuitry 20 or the like, for maintaining a count of the number of cycles about the delay line since the temperature dependent measurement invertor 16 has been switchably connected to the oscillating circuit 12. See block 34 of FIG. 2B. In an example embodiment, the counter circuitry is switchably connected, such as by the third switch $S_3$, to the delay line during the measurement phase and increments a counter that begins at a predefined value, such as 0, upon the detection of each clock pulse, such as upon the detection of the rising edge of each clock pulse, generated by the temperature dependent measurement invertor. Thus, the counter circuit effectively maintains a count of the number of cycles of the clock pulse about the delay line during the measurement phase.

As shown in blocks 26 of FIG. 2A and block 36 of FIG. 2B, the apparatus 10 of an example embodiment also includes means, such as detection circuitry 18 or the like, for detecting an instance in which the clock pulse has been stretched so as to equal or exceed the period of the clock pulse. As described above and as shown in FIGS. 7, 8A and 8B, the clock pulse is increased, such as by a predefined amount, during each cycle about the delay line. As the period of the clock pulse does not vary, this repeated stretching of the clock pulse by the temperature depended measurement invertor 16 eventually causes the clock pulse to stretch to such an amount that the clock pulse equals or exceeds the period of the clock pulse. In relation to the example embodiment of the clock pulse depicted in FIG. 7, the stretching of the clock pulse so as to equal or exceed the period of the clock pulse occurs in an instance in which the clock pulse disappears in that the clock signal $V_{CLK}$ remains at one level, such as a high level, and is no longer a pulse.

The detection circuitry 18 may be configured in various manners, but the detection circuitry of one example embodiment is depicted in FIG. 9. In this example embodiment and during the measurement phase as indicated by the control signal $V_{CTRL}$ being a logical 0 to allow the clock pulse $V_{CLK}$ to satisfy the AND gate 50, the clock pulse $V_{CLK}$ that is circulating about the delay line is provided via a resistor R to a capacitor $C_{CD}$. As a result of the repeated stretching of the clock pulse, the voltage $V_{CD}$ across the capacitor $C_{CD}$ gradually increases as shown in FIG. 10. The detection circuitry of this example embodiment includes a comparator 52 that is configured to compare the voltage $V_{CD}$ to a predefined threshold $V_{TH}$ and to generate an output voltage Wow. As shown in FIG. 11, the output voltage $V_{COMP}$ may change state, such as by being a logical 1, in an instance in which the detection circuitry determines that the clock pulse has disappeared as indicated by the voltage $V_{CD}$ satisfying the threshold voltage $V_{TH}$, such as by equaling or exceeding the threshold.

As shown in block 28 of FIG. 2A and block 38 of FIG. 2B, the apparatus 10 of an example embodiment also includes means, such as the processing circuitry 22 or the like, for determining the temperature based at least in part upon the number of cycles completed to stretch the clock pulse so as to equal or exceed the period of the clock pulse. In the illustrated embodiment, the processing circuitry receives the output signal $V_{COMP}$ of the detection circuitry 18 and, as such, is alerted as to the instance in which the clock pulse has been stretched so as to equal or exceed the period of the clock pulse, such as indicated by the change in state of the output voltage $V_{COMP}$, such as by being a logical 1. The processing circuitry is also in communication with the counter circuitry 20 so as to receive an indication of the number of cycles about the delay line since the temperature dependent measurement invertor 16 was switchably connected to the oscillating circuit 12 that were completed in order to stretch the clock pulse so as to equal or exceed the period of the clock pulse. In this regard, as the counter circuitry of an example embodiment is configured to increment the count upon the rising edge of the clock pulse output by the temperature dependent measurement invertor, the counter circuitry will increment the count upon each cycle about the delay line so long as the clock pulse is continued to be stretched, but will no longer increment the count once the clock pulse has been stretched so as to equal or exceed the period of the clock pulse as the clock pulse will no longer transition between the high and low states, thereby no longer having a transition from a low state to a high state as previously detected by the counter circuitry.

The processing circuitry 22 may be configured to determine the temperature in various manners. In an example embodiment, the processing circuitry is configured to determine the temperature in a manner such that the temperature has an indirect relationship to the number N of cycles that were needed to be completed to stretch the clock pulse so as to equal or exceed the period of the clock pulse. Additionally, the processing circuitry of this example embodiment is configured to determine the temperature based at least in part upon a difference between a time delay $T_D$ created by the delay line and a width $T_P$ in time of the clock pulse initially generated by the oscillating circuit 12. In this regard, the time delay $T_D$ created by the delay line is the time delay incurred for a clock pulse to make one complete cycle about the delay line. In addition, the width $T_P$ in time of the clock pulse initially generated by the oscillating circuit is the width of the clock pulse at the time at which the temperature dependent measurement invertor 16 is switchably connected to the oscillating circuit so as to form the delay line.

In this example embodiment, the processing circuitry 22 may be configured to determine the temperature based upon the temperature dependent resistance $R_T$ of the temperature dependent measurement invertor 16 as follows:

$$T_D - T_P = N\Delta W$$

$$\Delta W = \frac{T_D - T_P}{N}$$

$$R_T = \frac{T_D - T_P}{\ln(2)NC_L}$$

Based upon the predefined relationship between temperature and the temperature dependent resistance of the temperature dependent measurement invertor, the processing circuitry of this example embodiment is configured determine the temperature.

Alternatively, the processing circuitry 22 may be configured to determine the temperature based upon a predefined relationship between the number N of cycles about the delay line for the clock pulse to be stretched to equal or exceed the period of the clock pulse and the temperature. By way of example and in relation to the embodiment of the temperature dependent measurement invertor 16 having a temperature dependent resistor $R_T$, such as shown in FIG. 3, temperature dependent resistors may have various predefined resistances at different temperatures, such as shown in FIG. 12 with respect to three different temperature dependent resistors designated Ther I, Ther II and Ther III. Based upon prior simulations or prior tests, a relationship may be defined, such as shown graphically in FIG. 13 between the number of cycles completed to stretch a clock pulse so as to equal or exceed the period of the clock pulse as defined by a counter value and the temperature to which the resistor is exposed. In this regard, FIG. 13 depicts the predefined relationship the counter value and the temperature for the temperature dependent resistor designated as Ther III in FIG. 12. Thus, the processing circuitry of this example embodiment may be configured to determine the temperature based upon the number of cycles completed to stretch the clock pulse so as to equal or exceed the period of the clock pulse based upon the relationship therebetween, an example of which is depicted in FIG. 12.

As shown in block 40 of FIG. 2B, the apparatus 10 of an example embodiment also includes means, such as the processing circuitry 22 or the like, for switchably disconnecting the temperature dependent measurement invertor 16 from the oscillating circuit 12 in response to detection that the clock pulse has been stretched so as to equal or exceed the period of the clock pulse. In this example embodiment, in response to the signal $V_{COMP}$ from the detection circuitry 18 indicating that the clock pulse has been stretched so as to equal or exceed the period of the clock pulse, the processing circuitry is configured to output a control signal $V_{CTRL}$ causing the first switch $S_1$ to be closed and the second switch $S_2$, the third switch $S_3$ and the fourth switch $S_4$ to be opened. As a result, the temperature dependent measurement invertor is disconnected from the oscillating circuit such that the oscillating circuit returns to operation in the oscillating phase. The apparatus of this example embodiment then continues in the oscillating phase until such time that another temperature measurement is to be made, at which point in time an input is provided to the processing circuitry, such as from a user, a control system or the like, indicating that a temperature measurement is to be made and initiating the change to the measurement phase as described above.

As described above, the apparatus 10 of an example embodiment may be configured to utilize the clock pulse as an internal clock signal, such as for the detection circuitry 18, the counter circuitry 20 and the processing circuitry 22. Thus, the apparatus need not include an external or additional clock generator for the temperature-to-digital conversion.

As described above, the processing circuitry 22 may be embodied in a number of different ways. For example, the processing circuitry may be embodied as one or more of various hardware processing means such as a coprocessor, a microprocessor, a controller, a digital signal processor (DSP), a processing element with or without an accompanying DSP, or various other circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processing circuitry may include one or more processing cores configured to perform independently. A multi-core processor may enable multiprocessing within a single physical package. Additionally or alternatively, the processing circuitry may include one or more processors configured in tandem via the bus to enable independent execution of instructions, pipelining and/or multithreading.

In an example embodiment, the processing circuitry 22 may be configured to execute instructions stored in a memory device or otherwise accessible to the processing circuitry. Alternatively or additionally, the processing circuitry may be configured to execute hard coded functionality. As such, whether configured by hardware or software methods, or by a combination thereof, the processing circuitry may represent an entity (e.g., physically embodied in circuitry) capable of performing operations according to an embodiment of the present disclosure while configured accordingly. Thus, for example, when the processing circuitry is embodied as an ASIC, FPGA or the like, the processing circuitry may be specifically configured hardware for conducting the operations described herein. Alternatively, as another example, when the processing circuitry is embodied as an executor of instructions, the instructions may specifically configure the processing circuitry to perform the algorithms and/or operations described herein when the instructions are executed. However, in some cases, the processing circuitry may be a processor of a specific device configured to employ an embodiment of the present invention by further configuration of the processing circuitry by instructions for performing the algorithms and/or operations described herein. The processing circuitry may include, among other things, a clock, an arithmetic logic unit (ALU) and logic gates configured to support its operation.

In an example embodiment in which the processing circuitry 22 operates in accordance with computer instructions, a computer program product is also provided that includes a non-transitory computer readable medium with the computer instructions stored thereon. In this example embodiment, one or more of the procedures described above to be performed by the processing circuitry, such as the determination of the temperature of block 28 of FIG. 2A and block 38 of FIG. 2B, may be embodied by computer program instructions. In this regard, the computer program instructions which embody the procedures described above may be stored by a memory device of the apparatus 10 employing an embodiment of the present invention and executed by the processing circuitry of the apparatus. As will be appreciated, any such computer program instructions may be loaded onto a computer or other programmable apparatus (e.g., hardware) to produce a machine, such that the resulting computer or other programmable apparatus implements the above-described functions, such as the determination of the temperature. These computer program instructions may also be stored in a computer-readable memory that may direct a computer or other programmable apparatus, e.g., the processing circuitry, to function in a particular manner, such that the instructions stored in the computer-readable memory produce an article of manufacture, the execution of which implements the foregoing functions relating to the determination of the temperature. The computer program instructions may also be loaded onto a computer or other programmable apparatus, e.g., the processing circuitry, to cause a series of operations to be performed to produce a computer-implemented process such that the instructions which execute on the computer or other programmable apparatus provide operations for implementing the functions specified including the determination of the temperature.

As also described above, FIGS. 2A and 2B are flowcharts illustrating operations performed by the apparatus 10 and method of an example embodiment. Blocks of the flowcharts support combinations of means for performing the specified functions and combinations of operations for performing the specified functions for performing the specified functions. It will also be understood that one or more blocks of the flowcharts, and combinations of blocks in the flowcharts, may be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. An apparatus comprising:
  a delay line comprising a temperature dependent measurement inverter configured to stretch a clock pulse that was generated by an oscillating circuit during circulation of the clock pulse through the delay line, wherein an amount by which the clock pulse is stretched during a cycle about the delay line is dependent upon temperature;
  detection circuitry configured to detect an instance in which the clock pulse has been stretched so as to equal or exceed a period of the clock pulse; and
  processing circuitry configured to determine the temperature based at least in part upon a number of cycles completed to stretch the clock pulse so as to equal or exceed the period of the clock pulse.

2. An apparatus according to claim 1 wherein the temperature dependent measurement inverter is configured to have a different response time to transition from a high output to a low output than to transition from the low output to the high output.

3. An apparatus according to claim 2 wherein the temperature dependent measurement inverter comprises a temperature dependent resistive element having a resistance value that is dependent upon temperature.

4. An apparatus according to claim 2 wherein the temperature dependent measurement inverter comprises voltage to current conversion circuitry configured to receive and be responsive to an input signal having a temperature dependent voltage.

5. An apparatus according to claim 2 wherein the temperature dependent measurement inverter is configured to stretch the clock pulse during a respective cycle by an amount based upon a difference between the response time of the temperature dependent measurement inverter to transition from the high output to the low output and the response time of the temperature dependent measurement inverter to transition from the low output to the high output.

6. An apparatus according to claim 1 further comprising:
  a switch configured to switchably connect the temperature dependent measurement inverter to the oscillating circuit to form the delay line; and
  counter circuitry configured to maintain a count of the number of cycles about the delay line since the temperature dependent measurement inverter has been switchably connected to the oscillating circuit.

7. An apparatus according to claim 6 wherein the switch is also configured to switchably disconnect the temperature dependent measurement inverter from the oscillating circuit in response to detection by the detection circuitry that the clock pulse has been stretched so as to equal or exceed a period of the clock pulse.

8. An apparatus according to claim 1 wherein the delay line is further configured to repeatedly stretch the clock pulse during a plurality of cycles thereabout.

9. A method comprising:
  during circulation through a delay line, stretching a clock pulse that was generated by an oscillating circuit, wherein an amount by which the clock pulse is stretched during a cycle about the delay line is dependent upon temperature;
  detecting an instance in which the clock pulse has been stretched so as to equal or exceed a period of the clock pulse; and
  determining the temperature based at least in part upon a number of cycles completed to stretch the clock pulse so as to equal or exceed the period of the clock pulse.

10. A method according to claim 9 further comprising switchably connecting a temperature dependent measurement inverter to the oscillating circuit to form the delay line in order to stretch the clock pulse by the amount that is dependent upon the temperature.

11. A method according to claim 10 wherein the temperature dependent measurement inverter has a different response time to transition from a high output to a low output than to transition from the low output to the high output.

12. A method according to claim 11 wherein stretching the clock pulse comprises stretching the clock pulse during a respective cycle by an amount based upon a difference between the response time of the temperature dependent measurement inverter to transition from the high output to the low output and the response time of the temperature dependent measurement inverter to transition from the low output to the high output.

13. A method according to claim 10 further comprising maintaining a count of the number of cycles about the delay line since the temperature dependent measurement inverter has been switchably connected to the oscillating circuit.

14. A method according to claim 10 further comprising switchably disconnecting the temperature dependent measurement inverter from the oscillating circuit in response to detecting the instance in which the clock pulse has been stretched so as to equal or exceed the period of the clock pulse.

15. A method according to claim 9 wherein stretching the clock pulse comprises repeatedly stretching the clock pulse during a plurality of cycles about the delay line.

16. A method according to claim 9 wherein the period of the clock pulse is defined by a time delay introduced by circulation of the clock pulse through the delay line.

17. A computer program product comprising a non-transitory computer readable medium comprising computer instructions stored thereon and configured, upon execution, to:

receive an indication representative of a count of a number of cycles about a delay line that were completed to stretch a clock pulse that was generated by an oscillating circuit so as to equal or exceed a period of the clock pulse, wherein an amount by which the clock pulse is stretched during a cycle about the delay line is dependent upon temperature; and determine the temperature based at least in part upon the number of cycles completed to stretch the clock pulse so as to equal or exceed the period of the clock pulse.

18. A computer program product according to claim 17 wherein the computer instructions configured to determine the temperature comprise computer instructions configured to determine the temperature in a manner that has an indirect relationship to the number of cycles completed to stretch the clock pulse so as to equal or exceed the period of the clock pulse.

19. A computer program product according to claim 17 wherein the computer instructions configured to determine the temperature comprise computer instructions configured to determine the temperature based at least in part upon a difference between a time delay created by the delay line and a width in time of the clock pulse initially generated by the oscillating circuit.

20. A computer program product according to claim 17 wherein the computer instructions configured to determine the temperature comprise computer instructions configured to determine the temperature based upon a predefined relationship between the number of cycles and the temperature.

\* \* \* \* \*